United States Patent [19]

Kmetz

[11] 4,271,391
[45] Jun. 2, 1981

[54] DIGITAL VOLTMETER WITH ELECTRO-OPTICAL INDICATION OF THE WAVEFORM

[75] Inventor: Allan R. Kmetz, Chatham, N.J.

[73] Assignee: BBC Brown, Boveri & Co. Ltd., Baden, Switzerland

[21] Appl. No.: 90,104

[22] Filed: Nov. 1, 1979

[30] Foreign Application Priority Data

Nov. 24, 1978 [CH] Switzerland .............. 12047/78

[51] Int. Cl.³ .............. G01R 19/16; G01R 15/08
[52] U.S. Cl. .............. 324/103 P; 324/115; 324/121 R
[58] Field of Search .......... 324/103 P, 103 R, 121 R, 324/115, 99 D

[56] References Cited

U.S. PATENT DOCUMENTS

| | | | |
|---|---|---|---|
| 3,204,144 | 8/1965 | Deavenport | 324/121 R |
| 3,873,918 | 3/1975 | Talbert | 324/115 |
| 4,114,095 | 8/1978 | Pankoue et al. | 324/121 R |

*Primary Examiner*—Ernest F. Karlsen
*Attorney, Agent, or Firm*—Oblon, Fisher, Spivak, McClelland & Maier

[57] ABSTRACT

A digital voltmeter device is disclosed which displays both the numerical value of a measured voltage and a visual representation of an input waveform. The device includes an electro-optical display matrix utilizing display elements arranged in lines and columns. In order to make maximum use of the display matrix for representing input waveforms, the peak-to-peak voltage of the input waveform is measured and utilized as a reference for an analog to digital converter having output signals which form the address signals for the display matrix. The peak values of the input waveform thus appear at the top and bottom of the display matrix respectively.

10 Claims, 1 Drawing Figure

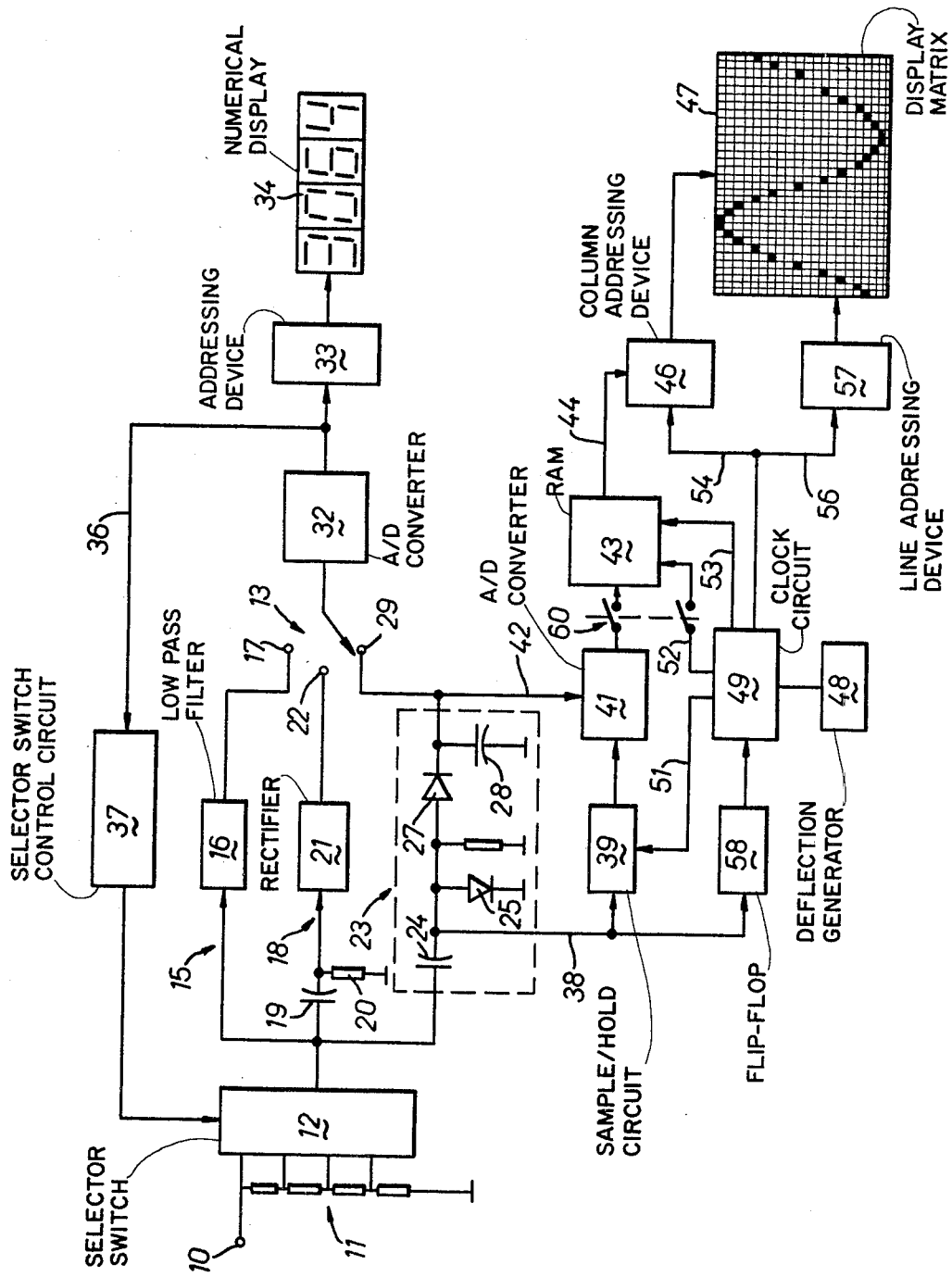

DIGITAL VOLTMETER WITH ELECTRO-OPTICAL INDICATION OF THE WAVEFORM

BACKGROUND OF THE INVENTION

1. Field of the Invention

This invention relates in general to a new and improved digital voltmeter which incorporates an electro-optical indication of the waveform being measured.

2. Description of the Prior Art

Voltmeters which indicate the measured voltage in digital form by means of liquid crystal displays are known. The common designs contain a full-wave rectifier for measuring alternating voltages wherefore the indicated measured value corresponds only with the effective value of the alternating voltage when its waveform is sine-shaped. Designs are also known which measure and indicate the effective value of the voltage independently of its waveform. However, so far no voltmeter is known which supplies information regarding the waveform. Often the waveform of technical alternating voltages is distorted, and the periodic signal and control voltages in electronic systems and units are practically never sine-shaped. Thus, it is almost always more important to visually observe the waveform than to measure a form-dependent voltage value.

Oscilloscopes are known which make visible the variation in time of a periodic voltage through the use of a liquid crystal matrix. Because these oscilloscopes are used instead of the customary cathode ray oscillographs, they must have a liquid crystal matrix with very many image elements arranged in lines and columns. The technical difficulties connected with the production of liquid crystal matrices and the addressing devices required for this purpose increase with the number of cells an indicating matrix contains. Accordingly, the costs for indicating matrices having a larger number of cells are unproportionately high.

SUMMARY OF THE INVENTION

Accordingly it is an object of the present invention to create a voltmeter which, in addition to a measured voltage value, also indicates the waveform of the measured voltage. Liquid crystal display elements are used, due to technical advantages, for the display of the voltage value and the waveform. The display matrix for the waveform contains only the minimum number of lines required for a useful representation. Means are also provided which automatically adapt the display to the amplitude of the waveform to be represented, thereby acheiving an optimum utilization of the lines of the display such that the peak values of the waveform appear at the top or bottom line of the matrix.

According to the present invention, these objects are accomplished by means of a digital voltmeter which is characterized by the combination of a digital voltmeter containing a peak detector for the measurement of the voltage difference between the peak values of an alternating voltage, a first analog-to-digital converter, a first addressing device, and a liquid crystal numerical display device, with an oscilloscope containing a sample-and-hold circuit, a second analog-to-digital converter, a second addressing device, and an electro-optical display device including liquid crystal elements arranged in lines and columns. The voltage appearing at the outlet of the peak detector is used as a reference voltage for the two analog-to-digital converters. The two peak values of the waveform being measured are displayed at the top and bottom, respectively, of the electro-optical display.

The new digital voltmeter has the advantage that it indicates two characteristic values, the measured value and the waveform, which previously could only be measured or observed by means of two independent instruments. The use of a liquid crystal matrix to display the waveform makes it possible to build a compact, manageable, and disproportionately flat unit which can be operated by a battery and is, therefore, independent of its location. The automatic, practically analog adaptation of the amplitude of the waveform to be indicated to the number of lines of the indicating matrix makes it possible to use a matrix with a minimum number of lines which simplifies the production of the matrix and of the addressing device required for it so that its operational safety is increased and the production costs are considerably reduced. Finally, the new digital voltmeter has all the well known advantages provided by liquid crystal displays such as an image which is clear in full ambient light. In a darkened environment, the liquid crystal display can be lit from the rear in the known manner.

In the case of a first preferred embodiment of the new digital voltmeter, the numerical display device and the display device of the oscilloscope are designed as one component.

In the case of a second preferred embodiment, a storage means is provided between the second analog-to-digital converter and the second addressing device for adapting the sequence in time of the signals produced by the second analog-to-digital converter to the signals passed on to the second addressing device.

In the case of still another preferred embodiment, a switch is provided to interrupt the signal lines between the second analog-to-digital converter and the inlet of the storage means as well as to interrupt the clock signals for the writing-in and cancelling of the address signal in the storage means. The switch thereby allows for a permanent storage and representation of a selected waveform.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a block diagram of a preferred embodiment of the digital voltmeter of the present invention.

DESCRIPTION OF THE PREFERRED EMBODIMENTS

Referring now to FIG. 1, a digital voltmeter according to the present invention is shown containing an input terminal 10 for receiving an input voltage to be measured and displayed. The input terminal is connected to a potentiometer circuit 11 which is referenced to ground. The outputs of the potentiometer circuit are connected to the inputs of a measuring range selector switch 12. Three channels lead from the output of this switch to a commutator 13. The first channel 15 is provided for measuring D.C. voltage and contains a low-pass filter 16 whose output is connected with terminal 17 of the commutator. The second channel 18 contains a blocking capacitor 19, a leakage resistance 20, and a full-wave rectifier 21 whose output is connected with terminal 22 of the commutator. The third channel 23 contains a peak-to-peak detector with a clamping circuit and is connected with terminal 29 of the commutator. Third channel 23 includes a blocking capacitor 24, a bypass rectifier 25, a charging rectifier 27, and a storage capacitor 28. The clamping circuit has the effect of shifting the lowest point of the input waveform to ground potential such that the voltage appearing across capacitor 28 corresponds to the voltage between the two peak valves of the input waveform.

The output of commutator 13 is fed to the input of a first analog-to-digital converter 32 whose outputs are connected to the inputs of an addressing device 33 associated with a numerical display device 34. A suitable addressing device is described in the publication *Electronics*, Vol. 6, December 1973, on pages 99–102.

An additional line 36 leads from the output of the commutator 13 to a circuit 37 whose output is connected with the measuring range selector switch 12. The circuit 37 sets the selector switch automatically, as a function of the output signals of the analog-to-digital converter, at the range which permits the most accurate indication of the voltage applied to the input terminal 10.

Another line 38 branches off from the peak-to-peak detector 24, 25, 27, 28 which leads to the input of a sample-and-hold circuit 39. The output of this circuit is connected to the signal input of a second analog-to-digital converter 41. Furthermore, a line 42 is provided which connects the output of the peak-to-peak detector with the reference voltage input of the second analog-to-digital converter. Preferably a simultaneous converter or a converter operating according to the step-by-step method is used as the second analog-to-digital converter. The selected lines of the patterns to be displayed are addressed according to the output signals of the converter. The converter has x outputs whereby x is determined by the unbalanced equation $2^x \geq y$, where Y equals the number of lines of the display matrix. The outputs of the converter are connected with assigned inputs of a random access memory (RAM) 43. Lines 44 lead from the RAM to a column addressing device 46 whose outputs are connected with the columns of a liquid crystal display matrix 47. The line 38 additionally leads to the input of a flip-flop circuit 58 whose output is connected with a second signal input of the time clock circuit 49.

The unit additionally contains a deflection generator 48 which controls a subsequent time clock circuit 4. The time clock circuit has several outputs. Two lines 51, 52 with write-in signals lead to the sample-and-hold circuit 39 and to a first signal input of the RAM 43. Three additional lines 53, 54, 56 with read-out signals lead to a second signal input of the RAM, to the column addressing device 46, and to a line addressing device 57 of the display matrix 47.

A preferred design of the addressing devices for the columns or lines 46, 57, respectively, of the liquid crystal indicating matrix 47, is described in detail in German Pat. No. 24 14 608.

In the following description of the operation of the new digital voltmeter with waveform display, it is assumed that an A.C. voltage is applied to the input terminal 10 and that the contact arm of the commutator 13 contacts the terminal 29. A D.C. voltage appears at the output of the peak-to-peak detector 24, 25, 27, 28 which is proportional to the difference between the positive and the negative peak voltage of the A.C. voltage applied to the input terminal. This D.C. voltage is converted into digital signals in the first analog-to-digital converter 32 which are then fed to the addressing device 33 in the known manner. The structure and the operating method of the addressing and indicating devices 33 and 34 are described in detail in the previously mentioned publication *Electronics*, Vol. 6, December 1973, pages 99–102, and thus are incorporated herein by reference. The numerical display device 34 indicates the voltage between the positive and the negative peak value of the A.C. voltage. The digital signals at the output of the analog-to-digital converter additionally act through the circuit 37 to switch the measuring range selector switch 12 to a range such that all decimal positions of the display device are used to display the measured voltage.

The voltage at the input of the peak-to-peak detector 24, 25, 27, 28 is also fed to the sample-and-hold circuit 39 over the line 38. This circuit produces a sequence of analog signals whereby the amplitudes of the successive analog signals correspond to the waveform of the input voltage. The sequence of analog signals is fed to the input of the second analog-to-digital converter 41. As previously described, the output voltage of the peak-to-peak detector 24, 25, 27, 28 is fed to this second analog-to-digital converter as a reference voltage. The voltage difference between the negative and the positive peak values of the waveform to be displayed corresponds to the lowest or highest digital value at the outlet of the converter independent of the absolute value and of changes or fluctuations. The output signals are used for addressing the lines of the display matrix whereby the lowest digital value is used as the address for the lowest line and the highest digital value for the highest line. Thus the two peak values of the waveform appear on the top or bottom line of the matrix.

The output signals of the analog-to-digital converter 41 are fed to the inlet of the RAM 43. The RAM can be considered as a sequential converter into which address signals are written in at one rate and read out at another rate for the optical representation.

A switch 60 is provided in the preferred embodiment for interrupting the address signal lines between the second analog-to-digital converter 41 and the RAM 43 and for interrupting the line 52 from the time clock. The interruption of these lines has the effect that the last stored waveform is not cancelled and replaced by another waveform, but can be displayed as a "standing" image practically for any length of time.

The timer clock circuit 49 produces the clock signals required for the processing and display of the input voltage. A first clock signal is fed to the sample-and-hold circuit 39 over the line 51 and determines the sequence in time and the duration of the analog signals for the second analog-to-digital converter 41. A second clock signal is fed to the RAM 43 over the line 52 and controls the write-in of the digital amplitude signals from the analog-to-digital converter. A third clock signal is fed to the RAM over the line 53 and controls the read-out of the stored amplitude signals and controls the input of these signals into the column addressing device 46 of the display matrix. A fourth clock signal is fed to the two addressing devices 46 and 57 over the lines 54 and 56 in order to control the lines and columns of the matrix for the representation of a point sequence corresponding to the waveform. The structure and the operating method of a preferred embodiment of the addressing device and the display matrix are described in the previously mentioned German Pat. No. 24 14 608 and are incorporated here by reference.

The line 38 feeds the voltage to be displayed from the input of the peak-to-peak detector 24, 25, 27, 28 to the input of the flip-flop circuit 58. This circuit produces an output pulse at a definite point in time or phase angle of the cyclic voltage, such as at the lowest point of the waveform, which is fed to the timer clock circuit 49 in order to synchronize the clock signal with the frequency of the waveform to be displayed and to produce a "standing" image on the display matrix. The sequence in time of the clock pulses produced by the timer clock circuit 49 can be controlled by adjusting the deflection generator 48. Thus the horizontal extension of the waveform to be represented, for example, a full or half period or even several periods of the waveforms can be represented.

If the display matrix 47 displays the image of a sine-shaped A.C. voltage, the effective value of the A.C. voltage can be displayed on the numerical display device 34 by moving the arm of the switch 13 to the terminal 22.

If a D.C. voltage is applied to the input terminal 10 of the measuring unit, its value is indicated as soon as the contact arm of the switch 13 is moved to the terminal 17. It is quite clear that the display matrix 47 is not excited when a D.C. voltage is applied to the input terminal 10.

As was previously described, the voltage between the two peak values of a cyclically changing voltage is used as a reference voltage for the second analog-to-digital converter. Thus the peak values of the waveform are indicated at the top or bottom line of the display matrix. The result of this kind of representation is that the zero line of an A.C. voltage is only at the center line (or between the two center lines) of the display matrix when the peak voltages of the two half-waves are the same. In the case of an A.C. voltage whose positive half-wave has a phase intersection of 145°, i.e. whose positive voltage amounts to about 70% of the highest possible peak value, the zero line is moved upward by about 15° from the center of the display matrix. The highest point of the positive half-wave appears then at the top line and the lowest point of the negative half-wave at the bottom line of the display matrix. If the positive or the negative half-waves at a sine-shaped A.C. voltage are absent, then the remaining negative or positive half-wave is represented with an amplitude twice as large.

In the case of a practically tested embodiment of the new digital voltmeter with a waveform display, a liquid crystal display matrix was used with 18 lines and 32 columns. This matrix had approximately square display elements with a lateral length of about 0.9 mm and the distance between adjacent lines of about 0.1 mm. The duration in time of the analog signals produced in the sample-and-hold circuit amounted to about $10^{-6}$ seconds and these signals were held for about $10^{-5}$ seconds at the output of the sample-and-hold circuit or at the input of the second analog-to-digital converter, respectively.

It is quite clear that the described unit can also be used to represent the waveform of cyclically changing currents for which purpose, in a simplified manner, the voltage variation is represented through a low ohmic resistance in the circuit.

It is also quite clear that additional channels can be provided for the measuring of the mean value or effective value of cyclic non-sine-shaped voltages and pulse signals, in addition to the described channels for the measuring of the effective value of a sine-shaped A.C. voltage and D.C. voltage.

The digital voltmeter portion as well as the oscilloscope portion of the new voltmeter can be constructed using commercially available components which are known by any expert, and therefore these components are not described in detail.

What is claimed as new and desired to be secured by Letters Patent of the United States is:

1. A digital voltmeter device with an electro-optical display of an input waveform, comprising:
    peak detector means coupled to receive said input waveform for determining the peak-to-peak voltage of said input waveform;
    first analog-to-digital converter means coupled to receive the output of said peak detector means for converting said output from analog form to digital form;
    first addressing means coupled to receive the digital output signal from said analog-to-digital converter means for converting said digital output signal into a numerical address signal;
    liquid crystal numerical display means for receiving said numerical address signal, and for converting said numerical address signal into a visible display;
    sample and hold circuit means coupled to receive said input waveform, for sampling said input waveform at a controlled rate;
    second analog-to-digital converter means coupled to receive the sampling signal output of said sample-and-hold circuit means and to receive the output of said peak detector means, for converting said sampling signal into digital form, said second analog-to-digital converter means utilizing the output of said peak detector means as a scale factor;
    second addressing means coupled to receive the digital output signal of said second analog-to-digital converter means, for converting said digital output signal into a line address signal and a column address signal; and
    electro-optical display means coupled to receive said line and column address signals from said second addressing means for converting said addressing signals into a visible display, said display means including a plurality of liquid crystal elements arranged in lines and columns;
    said digital voltmeter device displaying said input waveform such that the upper peak value of said input waveform appears at the upper line of said electro-optical display means and the lower peak value of said input waveform appears at the lower line of said display.

2. A digital voltmeter device with an electro-optical display of an input waveform as recited in claim 1, wherein:
    said liquid crystal numerical display means and said electro-optical display means are a single unit.

3. A digital voltmeter device with an electro-optical display of an input waveform as recited in claim 1 wherein said peak detector means comprises:
    a blocking capacitor coupled to receive said input waveform, said capacitor acting to conduct alternating current voltages and to block direct current voltages;

a bypass rectifier coupled between the output of said blocking capacitor and ground, said bypass rectifier acting to conduct certain portions of said input waveform to ground;

a charging rectifier coupled to the output of said blocking capacitor, said charging rectifier acting to conduct portions of said input waveform; and a charging capacitor coupled between the output of said charging rectifier and ground, said charging capacitor acting to integrate the output of said charging rectifier.

4. A digital voltmeter device with an electro-optical display of an input waveform as recited in claim 1, further comprising:

random access memory means coupled between the output of said second analog-to-digital converter means and the input of said second addressing means for temporarily storing the output of said second analog-to-digital converter means, and for converting the rate of the output signal of said analog-to-digital converter means to an optimum input signal rate for said second addressing means.

5. A digital voltmeter device with an electro-optical display of an input waveform as recited in claim 4, further comprising:

switch means coupled between the output of said second analog-to-digital converter means and the input of said random access memory means for interrupting said input to said random access memory means such that the contents of said random access memory means are not replaced.

6. A digital voltmeter device with an electro-optical display of an input waveform as recited in claim 1, further comprising:

rectifier means coupled to receive said input waveform for converting said input waveform into a direct current signal, the amplitude of said direct current signal being proportional to the effective value of said input waveform; and commutator means coupled between the output of said rectifier means, the output of said peak detector means, and the input of said first analog-to-digital converter means, for alternatively coupling the outputs of said rectifer means and said peak detector means to the input of said first analog-to-digital converter means.

7. A digital voltmeter device with an electro-optical display of an input waveform as recited in claim 1, further comprising:

low-pass filter means coupled to receive said input waveform for removing alternating current voltage components from said input waveform; and commutator means coupled between the output of said low pass filter means, the output of said peak detector means, and the input of said first analog-to-digital converter means, for alternatively coupling the outputs of said low pass filter means and said peak detector means to the input of said first analog-to-digital converter means.

8. A digital voltmeter device with an electro-optical display of an input waveform as recited in claim 4, further comprising:

timer clock means coupled to said sample-and-hold circuit means, to said random access memory means, to said first addressing means, and to said second addressing means for generating clock signals.

9. A digital voltmeter device with an electro-optical display of an input waveform as recited in claim 8, further comprising:

flip-flop circuit means coupled between said peak detector means and the input of said timer clock means for synchronizing the output of said timer clock means with said input waveform.

10. A digital voltmeter device with an electro-optical display of an input waveform as recited in claim 1, further comprising:

range selector switch means coupled to receive said input waveform, for adjusting the amplitude of said input waveform, the output of said range selector switch means being coupled to the input of said peak detector means; and range selector circuit means coupled between the output of said first analog-to-digital converter means and a control input of said range selector switch means for controlling said range selector switch means such that the entire capacity of said liquid crystal numerical display means is utilized.

* * * * *